(12) United States Patent
Pan et al.

(10) Patent No.: US 8,215,648 B2
(45) Date of Patent: Jul. 10, 2012

(54) COLLET MOUNTING ASSEMBLY FOR A DIE BONDER

(75) Inventors: Xiangsheng Pan, Tsuen Wan (HK); Gary Peter Widdowson, Mid Levels (HK)

(73) Assignee: ASM Assembly Automation Ltd, Hong Kong (HK)

( * ) Notice: Subject to any disclaimer, the term of this patent is extended or adjusted under 35 U.S.C. 154(b) by 1115 days.

(21) Appl. No.: 12/106,368

(22) Filed: Apr. 21, 2008

(65) Prior Publication Data

US 2009/0261537 A1 Oct. 22, 2009

(51) Int. Cl.
*B23B 31/20* (2006.01)
(52) U.S. Cl. ........................ 279/43.2; 279/43.1
(58) Field of Classification Search .............. 279/23, 279/1, 43.1, 43.2, 46.1, 46.2, 46.3, 46.8, 279/102, 103; 72/466.5, 466.6, 479, 482.92, 72/478, 481.1, 482.93
See application file for complete search history.

(56) References Cited

U.S. PATENT DOCUMENTS

| | | | | |
|---|---|---|---|---|
| 508,314 A * | 11/1893 | Hill | | 279/23.1 |
| 2,299,972 A * | 10/1942 | Gallen et al. | | 279/29 |
| 2,914,331 A * | 11/1959 | Gallen | | 279/50 |
| 3,050,617 A * | 8/1962 | Lasch, Jr. et al. | | 228/4.5 |
| 3,125,906 A * | 3/1964 | Johnson | | 228/4.5 |
| 3,451,607 A * | 6/1969 | Miller et al. | | 228/1.1 |
| 3,738,560 A * | 6/1973 | Kulicke et al. | | 228/10 |
| 4,589,586 A * | 5/1986 | Polansky | | 228/179.1 |
| 4,875,279 A * | 10/1989 | Sakiadis | | 29/740 |
| 7,303,111 B2 * | 12/2007 | Gaunekar et al. | | 228/4.1 |
| 7,347,129 B1 * | 3/2008 | Youtsey | | 81/467 |
| 2008/0017293 A1 * | 1/2008 | Chung et al. | | 156/64 |

* cited by examiner

*Primary Examiner* — Daniel Howell
*Assistant Examiner* — Paul M Janeski
(74) *Attorney, Agent, or Firm* — Ostrolenk Faber LLP

(57) ABSTRACT

A collet mounting assembly for a die bonder comprises a collet mount having a first end attached to the die bonder and a second end opposite the first end with a cavity defined in the second end for receiving a shaft of the collet. The collet mounting assembly further comprises a fastener for securing the collet inside the cavity of the collet mount. A compression force is generated around the shaft of the collet received in the collet mount by the flexing of the fastener when it is attached to the collet mount, for securing the collet within the cavity of the collet mount.

12 Claims, 4 Drawing Sheets

COLLET MOUNTING ASSEMBLY FOR A DIE BONDER

FIELD OF THE INVENTION

The present invention relates to bonders for electronic devices, and in particular, to die bonders incorporating replaceable pickup collets.

BACKGROUND AND PRIOR ART

Collets are used in die bonders for picking and placing electronic devices, such as Integrated Circuits (IC) and Light Emitting Diodes (LEDs), during semiconductor packaging and assembly. Collets often have to be replaced due to wear and tear, and the rate of replacing the collets depends on the extent of use of the collets and the material they are made of. In some cases, a collet may have to be replaced many times in a day. As a result, substantial time may be wasted replacing the collets, during which the die bonder is unproductive. Therefore, it would be desirable to devise a convenient and swift method for detaching and mounting collets to the collet holder.

Typically, a collet in a die bonder may be fixed to a collet holder of a bondhead using a screw or set screw. There are disadvantages in such a system. Firstly, in production environments, tools such as an Allen key that is required for tightening the screws tend to be misplaced easily and valuable time would be wasted looking for the tools. In addition, as maintaining a clean and neat production environment is very important, there is a preference for a collet assembly system that does not require the use of any tool. Secondly, the torque that is required for tightening and loosening the screws may lead to stress in the bondhead. This undue stress is particularly undesirable for a bondhead using flexure-based mechanisms at the mounting area, which are prone to buckling and breaking under excessive tightening torques and forces.

Therefore, those skilled in the art are constantly striving to provide an improved collet mounting assembly to address these identified problems.

SUMMARY OF THE INVENTION

It is thus an object of the invention to seek to provide a collet mounting assembly for efficiently attaching and/or detaching a collet from a collet mount of a die bonder to solve the above and other problems.

According to a first aspect of the invention, there is provided a collet mounting assembly for a die bonder, comprising a collet mount having a first end attached to the die bonder and a second end opposite the first end with a cavity defined in the second end for receiving a shaft of a collet; and a fastener for securing the collet inside the cavity of the collet mount, wherein the fastener is operative to flex when attached to the collet mount for generating a compression force around the shaft of the collet within the collet mount to secure the collet within the cavity of the collet mount.

According to a second aspect of the invention, there is provided a method for attaching a collet to a die bonder, comprising the steps of: inserting a shaft of the collet into a cavity in a second end of a collet mount, wherein the collet mount has a first end attached to the die bonder and the second end having a cavity extending into the second end of the collet mount opposite of the first end; and attaching a fastener to the collet mount such that the fastener flexes to apply a compression force to the shaft inside the cavity to secure the collet in the cavity.

According to a third aspect of the invention, there is provided a method for attaching a collet to a die bonder, comprising the steps of: attaching a fastener to a second end of a collet mount, wherein the collet mount has a first end attached to the die bonder and the second end having a cavity extending into the second end of the collet mount opposite of the first end; and inserting a shaft of the collet into the cavity such that the fastener applies a compression force to the shaft inside the cavity to secure the collet in the cavity.

It will be convenient to hereinafter describe the invention in greater detail by reference to the accompanying drawings. The particularity of the drawings and the related description is not to be understood as superseding the generality of the broad identification of the invention as defined by the claims.

BRIEF DESCRIPTION OF THE DRAWINGS

The present invention will be readily appreciated by reference to the detailed description of preferred embodiments of the invention when considered with the accompanying drawings, in which.

DETAILED DESCRIPTION OF THE PREFERRED EMBODIMENTS OF THE INVENTION

The preferred embodiments of the present invention will be described hereinafter with reference to the accompanying drawings.

Figure 1:
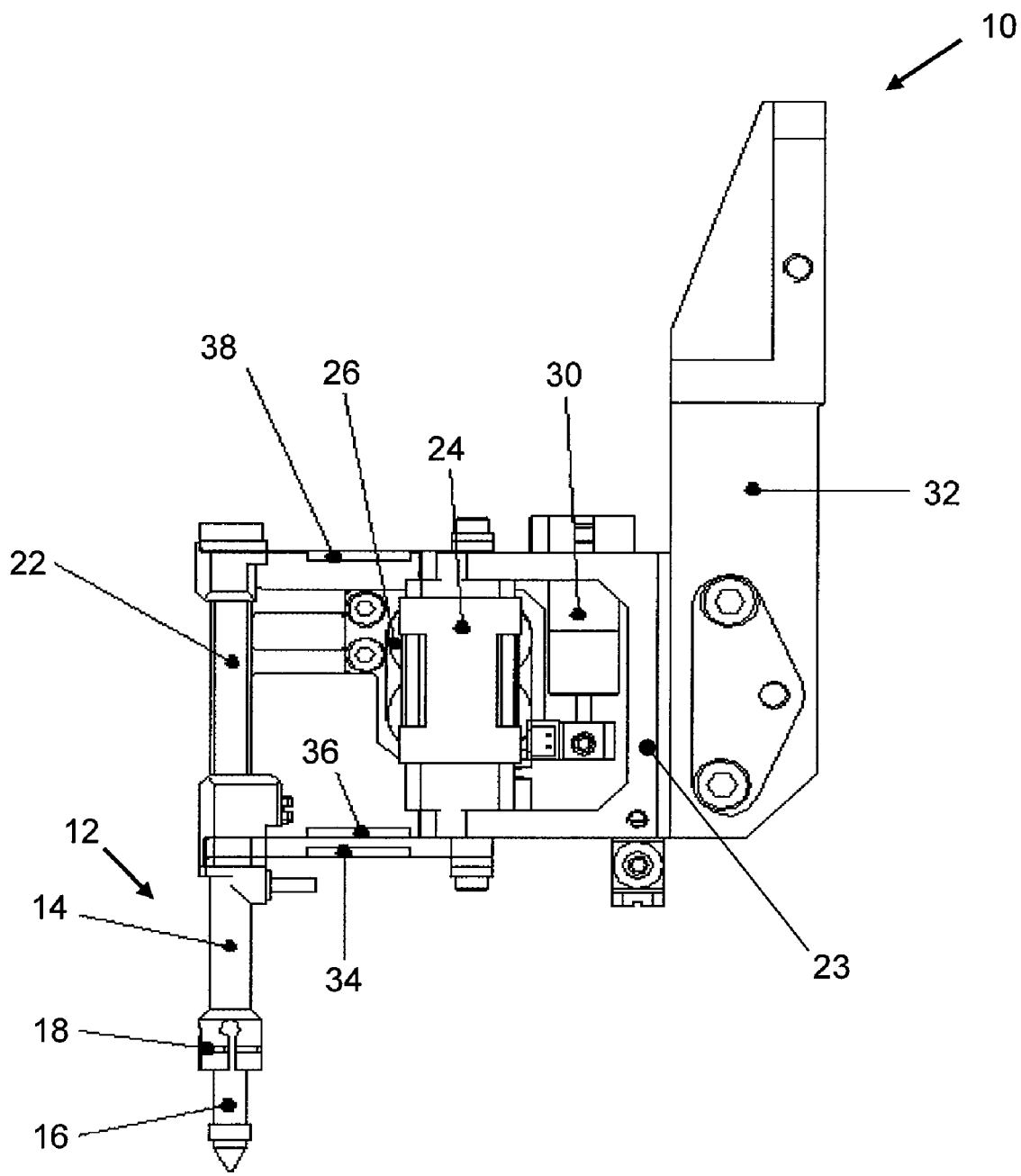
FIG. 1 is a side view of a die bondhead of a die bonder incorporating a collet mounting assembly according to a first preferred embodiment of the invention.

FIG. 1 is a side view of a die bondhead 10 of a die bonder incorporating a collet mounting assembly 12 according to a first preferred embodiment of the invention. The collet mounting assembly 12 comprises a collet mount 14, a collet 16 and a fastener 18. The collet mount 14 has one end attached to the die bonder and an opposite end with a cavity for receiving a shaft of the collet 16. The fastener 18 is attachable to the collet mount 14 at the end of the collet mount 14 which receives the shaft of the collet 16.

The fastener 18 is machined to flex and apply a substantially uniform compression force around the periphery of the shaft of the collet 16 which secures the collet 16 inside the cavity of the collet mount 14. The fastener 18 also exhibits sufficient tolerance for holding the collet 16 securely in position when the die bondhead accelerates at high speed.

In the first embodiment, the fastener 18 is a flexible clip, such as a spring clip, which is insertable into a groove 20 (see FIG. 2) formed on an outer periphery of the collet mount 14 proximate the cavity to cause the collet mount 14 to engage the shaft of the collet 16. It is envisioned that other types of flexing devices may be used as a fastener in accordance with other embodiments of this invention.

A movable mounting member 22 connects the collet mount 14 to a motion mechanism which is mounted onto a bond body 23 of the die bondhead 10. The motion mechanism may be in the form of a voice coil motor 24 which further comprises a coil 26 that drives the movable mounting member 22, and therefore the collet 16, vertically. A position sensor 30 detects vertical positional changes of the collet mounting assembly 12. The bond body 23 also connects the collet mounting assembly 12 to a high speed motion stage 32. A guiding mechanism comprising flexures 34, 36, 38 limit the motion of the collet 16 along vertical directions. However, it is envisioned that one skilled in the art will recognize that this invention may be implemented in conjunction with any type of bondhead.

Figure 2:
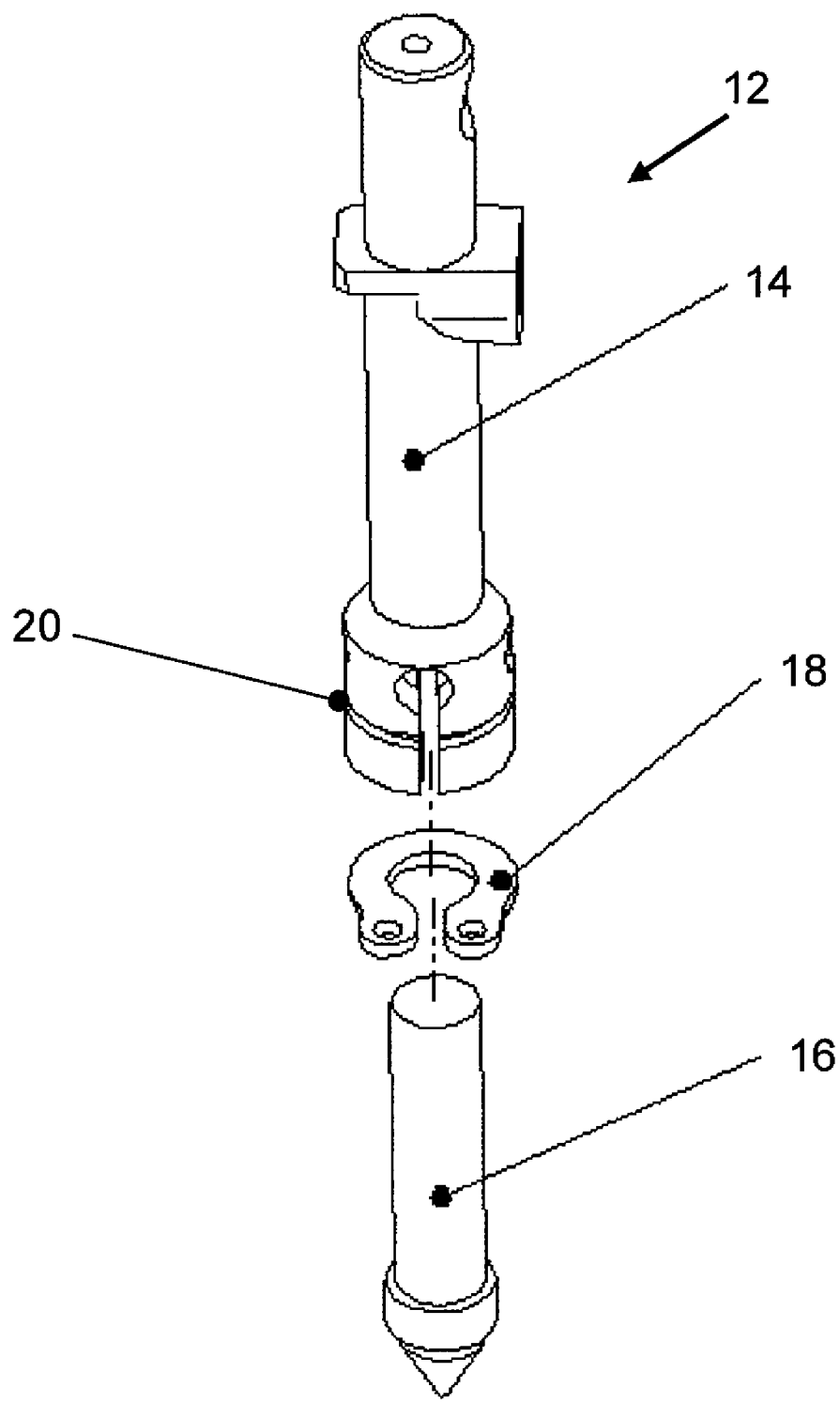
FIG. 2 is an exploded view of the collet mounting assembly of FIG. 1 including a flexible clip for mounting a collet.

FIG. 2 is an exploded view of the collet mounting assembly 12 of FIG. 1 including the spring clip 18 for mounting the collet 16. The collet mount 14 and the spring clip 18 are preferably made of a highly flexible material such as steel, aluminum, titanium, magnesium or engineering plastics. The cavity of the collet mount 14 has a width or inner diameter which is slightly greater than a width or outer diameter of the shaft of the collet 16, resulting in a small clearance between the cavity and the shaft of the collet to facilitate the insertion of the shaft into the collet mount 14.

Figure 3:
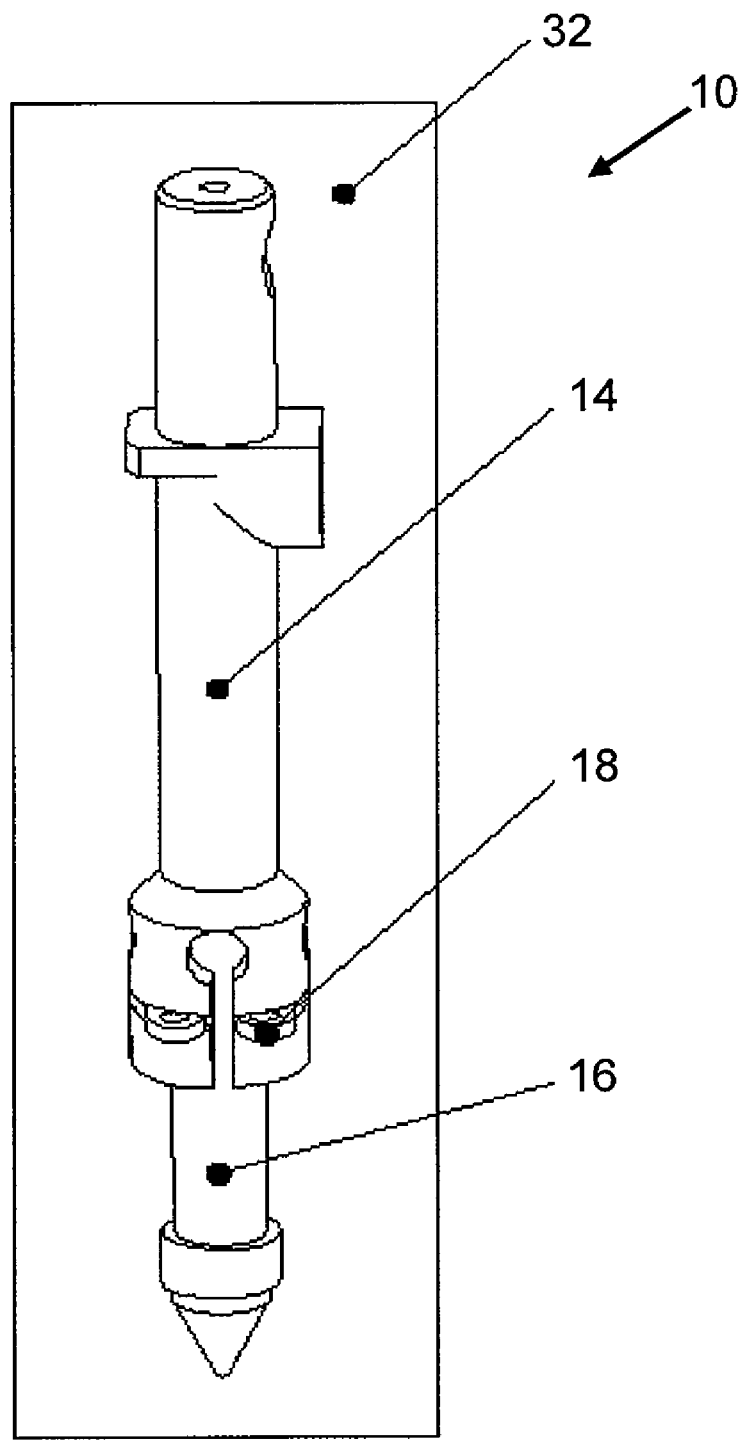
FIG. 3 is a side view of the collet mounting assembly of FIG. 2 wherein the collet is secured to the collet mount by the flexible clip.

FIG. 3 is a side view of the collet mounting assembly 12 of FIG. 2 wherein the collet 16 is secured to the collet mount 14 by the spring clip 18. After the shaft of the collet 16 has been positioned within the cavity of the collet mount 14, the spring clip 18 is slid into the groove 20 and snapped into position. The spring clip 18 provides a compression force to flex the collet mount 14, thus closing the clearance causing the collet mount 14 to grip the collet 16 tightly. The spring clip 18 applies a uniform compression force around the periphery of the collet 16 which reduces stress on the shaft of the collet 16. The collet mounting assembly 12 therefore does not require any tool for attaching or detaching the collet 16 as the spring clip 18 can be manually applied to and removed from the groove 20. An operator merely needs to exert a small vertical force by hand to separate the collet 16 from the collet mount 14 after removing the spring clip 18 from the groove 20.

Figure 4:
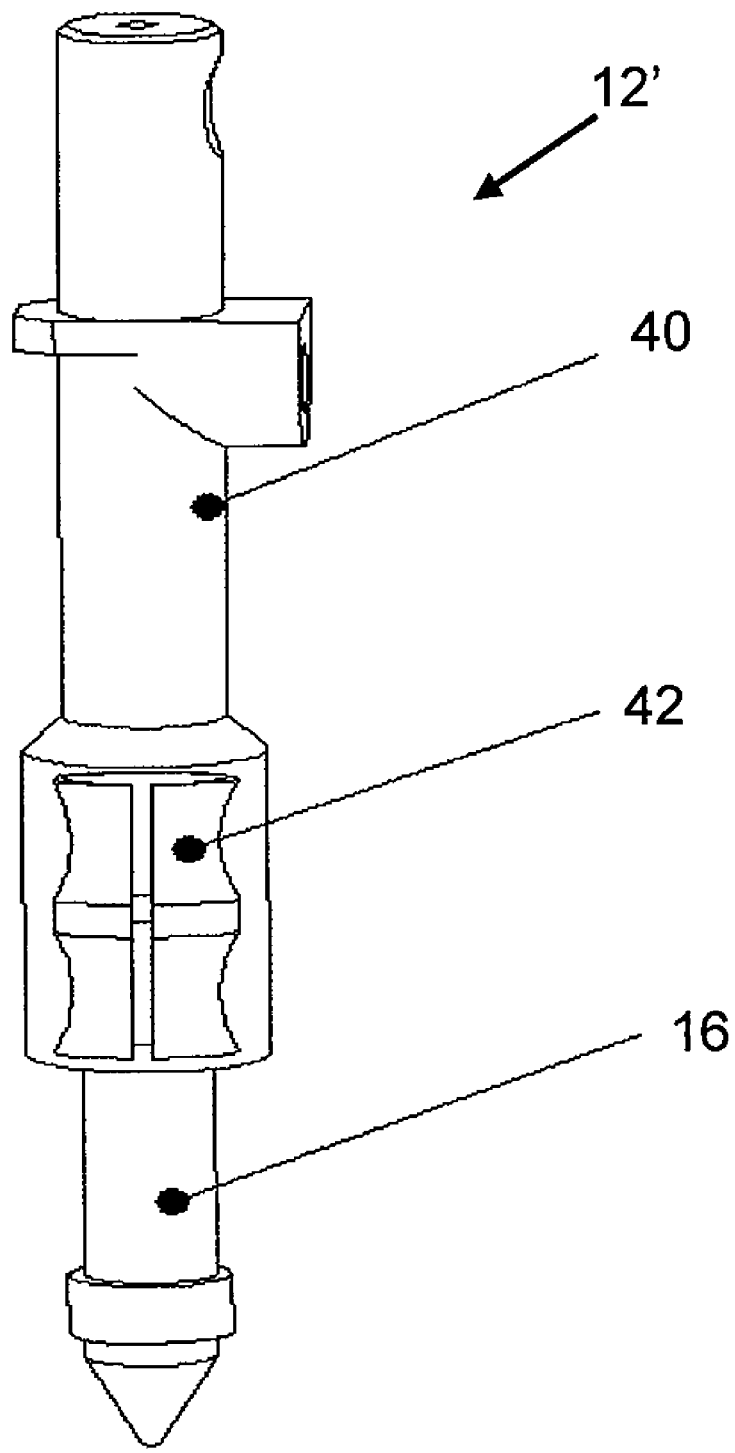
FIG. 4 is a side view of a collet mounting assembly according to a second preferred embodiment of the invention.

FIG. 4 is a side view of a collet mounting assembly 12' according to a second preferred embodiment of the invention. The fastener in this embodiment comprises a spring sheet flexure 42 which is insertable into the cavity of the collet mount 14. The spring sheet flexure 42 is preferably folded to form an elongated tubing which is positioned axially within the cavity of the collet mount 40 to engage the shaft of the collet 16 directly. It has a nominal width or diameter that is smaller than a width or diameter of the shaft of the collet 14. The spring sheet flexure 42 is preferably made of a highly flexible material such as steel, aluminum, titanium, magnesium, or engineering plastics.

Upon application of a small vertical upwards force, the spring sheet flexure 42 will be forced to flex and to open inside the collet mount 40 so as to allow the shaft of the collet 16 to be inserted into the collet mount 40. The compression force of the spring sheet flexure 42 is sufficient to hold the collet 16 firmly within the collet mount 40 while the bonding mechanism moves under high acceleration and velocity during bonding operations. To remove the collet 16, a vertical downwards force may be applied to pull the collet 16 from the spring sheet flexure 42.

It should be appreciated that the preferred embodiments of the invention described above provide collet mounting assemblies which permit quick and easy mounting and removal of a collet without the need for extraneous tools. This saves time and is more convenient than conventional ways for mounting collets. Another advantage is that the die bondhead is subjected to very little stress during collet changing since only a relatively small vertical force is needed for attaching or detaching the collet. Additionally, with the elimination of tightening torques arising from the use of a tool changer such as an Allen key, stress induced on a die bondhead through tightening torques can be avoided.

The invention described herein is susceptible to variations, modifications and/or additions other than those specifically described and it is to be understood that the invention includes all such variations, modifications and/or additions which fall within the spirit and scope of the above description.

The invention claimed is:

1. A collet mounting assembly of a die bonder, the collet mounting assembly comprising:
    a collet mount comprising a first end attached to the die bonder and a second end opposite the first end with a cavity defined in the second end to receive a shaft of a collet; and
    a fastener positioned and configured to secure the collet inside the cavity of the collet mount,
    wherein the fastener is operative to flex when attached to the collet mount so as to generate a compression force around the shaft of the collet within the collet mount to secure the collet within the cavity of the collet mount.

2. The collet mounting assembly as claimed in claim 1, wherein the fastener comprises:
    a flexible clip.

3. The collet mounting assembly as claimed in claim 2, further comprising:
    a groove on an outer periphery of the collet mount proximate the cavity for insertion of the fastener for causing the collet mount to engage the shaft of the collet.

4. The collet mounting assembly as claimed in claim 1, wherein the collet mount is made of a highly flexible material selected from the group consisting of:
    steel, aluminum, titanium, magnesium and engineering plastics.

5. The collet mounting assembly as claimed in claim 1, wherein the fastener is made of a highly flexible material selected from the group consisting of:
    steel, aluminum, titanium, magnesium and engineering plastics.

6. The collet mounting assembly as claimed in claim 1, wherein the cavity in the second end of the collet mount has a width which is slightly greater than a width of the shaft resulting in a small clearance when the shaft is positioned within the cavity, and
    wherein the fastener is operative to flex the collet mount and close the clearance between the cavity and the shaft of the collet causing the collet mount to grip the collet tightly.

7. The collet mounting assembly as claimed in claim 1, wherein the fastener is operative to apply a substantially uniform force around the periphery of the collet.

8. The collet mounting assembly as claimed in claim 1, wherein the fastener is machined to exhibit sufficient tolerance to hold the collet securely in position when a die bondhead is accelerating at high speed.

9. A method for attaching a collet to a die bonder, comprising the steps of:
    inserting a shaft of the collet into a cavity in a second end of a collet mount wherein the collet mount has a first end attached to the die bonder and the second end having a cavity extending into the second end of the collet mount opposite of the first end; and
    attaching a fastener to the collet mount such that the fastener flexes to apply a compression force to the collet mount causing the collet mount to grip and secure the shaft of the collet inside the cavity.

10. The method of claim 9, further comprising:
    inserting the fastener into a groove around a periphery of said collet mount proximate the second end to cause the collet mount to engage the shaft of the collet.

11. The method of claim 9, wherein the cavity in the second end of the collet mount has a width which is slightly greater than a width of the shaft resulting in a small clearance when the shaft is positioned within the cavity, and wherein a fastener is operative to flex the collet mount and close the clearance between the cavity and the shaft of the collet causing the collet mount to grip the collet tightly.

12. The method of claim 9, wherein the compression force is a substantially uniform force applied around a periphery of the shaft in the cavity.

* * * * *